(12) United States Patent
Hsu et al.

(10) Patent No.: US 10,955,461 B2
(45) Date of Patent: *Mar. 23, 2021

(54) SMART AND EFFICIENT PROTOCOL LOGIC ANALYZER CONFIGURED WITHIN AUTOMATED TEST EQUIPMENT (ATE) HARDWARE

(71) Applicant: Advantest Corporation, Tokyo (JP)

(72) Inventors: Linden Hsu, San Jose, CA (US); Ben Rogel-Favila, San Jose, CA (US); Duane Champoux, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 57 days.

This patent is subject to a terminal disclaimer.

(21) Appl. No.: 15/981,646

(22) Filed: May 16, 2018

(65) Prior Publication Data

US 2019/0353696 A1 Nov. 21, 2019

(51) Int. Cl.
*G06F 11/00* (2006.01)
*G01R 31/28* (2006.01)
(Continued)

(52) U.S. Cl.
CPC ..... *G01R 31/2834* (2013.01); *G01R 31/3177* (2013.01); *G01R 31/31703* (2013.01); *G01R 31/31705* (2013.01); *G01R 31/31907* (2013.01); *G01R 31/31908* (2013.01); *G01R 31/31921* (2013.01); *G01R 31/318307* (2013.01); *G06F 11/079* (2013.01); *G06F 11/2733* (2013.01)

(58) Field of Classification Search
CPC . G01R 31/2834; G06F 11/008; G06F 11/079; G06F 11/3409; G06F 11/3604

USPC .......................................................... 714/37
See application file for complete search history.

(56) References Cited

U.S. PATENT DOCUMENTS 6,173,440 B1   1/2001   Darty
6,449,741 B1   9/2002   Organ et al.
(Continued)

FOREIGN PATENT DOCUMENTS

EP   3518441 A1   7/2019

OTHER PUBLICATIONS

Nagappan, Meiyappan. "Analysis of execution log files." In 2010 ACM/IEEE 32nd International Conference on Software Engineering, vol. 2, pp. 409-412. IEEE, 2010. (Year: 2010).

*Primary Examiner* — Sarai E Butler

(57) ABSTRACT

A method for monitoring a communication link between a device under test (DUT) and automated test equipment is disclosed. The method comprises monitoring data traffic associated with testing a DUT using a protocol analyzer module, wherein the data traffic comprises a flow of traffic between the DUT and a protocol core of a programmable logic device, wherein the protocol analyzer module is integrated within the programmable logic device, wherein the programmable logic device is controlled by a system controller and is operable to generate commands and data to test the DUT, and wherein the protocol core is operable to generate signals to communicate with the DUT using a protocol associated with the DUT. The method further comprises saving results associated with the monitoring in a memory associated with the protocol analyzer module and transmitting the results upon request to an application program executing on the system controller.

17 Claims, 11 Drawing Sheets

(51) Int. Cl.
  *G01R 31/3177* (2006.01)
  *G01R 31/319* (2006.01)
  *G01R 31/317* (2006.01)
  *G06F 11/273* (2006.01)
  *G01R 31/3183* (2006.01)
  *G06F 11/07* (2006.01)

(56) References Cited

U.S. PATENT DOCUMENTS

| | | | |
|---|---|---|---|
| 9,164,821 B2 | 10/2015 | Burghard et al. | |
| 9,495,267 B2 | 11/2016 | Buege et al. | |
| 9,958,502 B2 | 5/2018 | Goh et al. | |
| 10,379,158 B2* | 8/2019 | Champoux | G01R 31/3177 |
| 2006/0123266 A1* | 6/2006 | Matsumoto | G06Q 20/10 |
| | | | 714/1 |
| 2007/0263649 A1* | 11/2007 | Cuni | H04L 43/00 |
| | | | 370/412 |
| 2008/0005630 A1* | 1/2008 | Adsitt | G01R 31/318335 |
| | | | 714/718 |
| 2008/0126874 A1* | 5/2008 | Oyadomari | G06F 11/008 |
| | | | 714/39 |
| 2010/0142543 A1* | 6/2010 | Shaikh | H04L 45/04 |
| | | | 370/401 |
| 2012/0079132 A1* | 3/2012 | Liu | H04L 1/0002 |
| | | | 709/233 |
| 2013/0266154 A1* | 10/2013 | McCormack | H04R 3/00 |
| | | | 381/117 |
| 2014/0122921 A1* | 5/2014 | Imamichi | G06F 16/9027 |
| | | | 714/6.2 |
| 2014/0236524 A1* | 8/2014 | Frediani | G01R 31/2834 |
| | | | 702/108 |
| 2016/0112287 A1* | 4/2016 | Farmer | H04L 43/04 |
| | | | 709/224 |
| 2018/0224502 A1* | 8/2018 | Champoux | G06F 11/27 |
| 2019/0353696 A1* | 11/2019 | Hsu | G01R 31/31703 |

* cited by examiner

SMART AND EFFICIENT PROTOCOL LOGIC ANALYZER CONFIGURED WITHIN AUTOMATED TEST EQUIPMENT (ATE) HARDWARE

CROSS-REFERENCE TO RELATED APPLICATIONS

Related Applications

The present application is related to U.S. patent application Ser. No. 15/981,634, filed May 16, 2018, entitled "TRAFFIC CAPTURE AND DEBUGGING TOOLS FOR IDENTIFYING ROOT CAUSES OF DEVICE FAILURE DURING AUTOMATED TESTING," naming Linden Hsu, Ben Rogel-Favila, Michael Jones, Duane Champoux, and Mei-Mei Su as inventors. That application is incorporated herein by reference in its entirety and for all purposes.

The present application is related to U.S. patent application Ser. No. 15/916,126, filed Mar. 8, 2018, entitled "A LOG POST PROCESSOR FOR IDENTIFYING ROOT CAUSES OF DEVICE FAILURE DURING AUTOMATED TESTING," naming Linden Hsu, Ben Rogel-Favila, Bob Collins, Ed Chow, Michael Jones, Duane Champoux and Mei-Mei Su as inventors. That application is incorporated herein by reference in its entirety and for all purposes.

FIELD OF THE INVENTION

The present disclosure relates generally to the field of electronic device testing systems and more specifically to the field of electronic device testing equipment for testing devices under test (DUTs).

BACKGROUND OF THE INVENTION

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

ATE is typically used to test anywhere from one to several hundred devices under the test (DUTs) at the same time. In order to verify that the ATE is communicating properly with the DUTs, workbench equipment such as oscilloscopes and protocol analyzer can be used. These devices are typically bulky, cumbersome and inordinately expensive. Further, they require highly trained engineers to use and to interpret the data. As a result, these devices are not generally suitable for production facilities.

Protocol analyzers, for example, are passive diagnostic tools that collect, organize, and display protocol traffic occurring on a serial link. Protocol analyzers use large amounts of memory to store the traffic, typically many gigabytes. The stored traffic represents one of two forms of data: raw and protocol. In raw mode the protocol analyzer saves the serial data bit for bit in its memory. In protocol mode the protocol analyzer first decodes and descrambles the data prior to saving the data to memory. In both cases, the protocol analyzer uses a prohibitively large amount of memory to store all the diagnostic data for an engineer to be able to analyze.

There are many situations where it is useful to have a standard protocol analyzer but financial, space and memory constraints limit the ability to have one. In such cases, lab engineers are not left with many choices for monitoring the signaling and communication link between the ATE and the DUTs.

Further, one of the drawbacks with conventional ATE is that they typically only report pass/fail results. In other words, the ATE only reports whether one or more devices under test (DUTs) passed or failed the respective test being executed. The ATE is not configured to identify root causes of device failure that occur during qualification testing. Typically, the ATE will not have any hardware or software-based tools built into it that would enable engineers to easily diagnose problems with the DUTs.

In a typical testing environment, the engineers operating the ATE will need to identify the cause of failure manually by collecting data logs and performing analysis on the logs. This approach is labor intensive, error prone and not scalable. It may also not yield the desired result since there may not be enough information available to the engineers to determine which data logs to analyze or how to find the root causes of device failure within the data logs. Further, traditional ATE systems do not contain any intelligence built into the hardware that would help engineers capture and automatically interpret and analyze diagnostic information pertaining to the tests.

BRIEF SUMMARY OF THE INVENTION

Accordingly, a need exists for a protocol analyzer that uses the pre-existing hardware of the tester to collect diagnostic information about the tests. Further, a need exists for a protocol analyzer that uses compression and selection to reduce the amount of memory it needs for collection. Also, a need exists for a protocol analyzer that can collect critical information relevant to an engineer, selectively discard the less critical information, and report the critical information to the engineer in an organized and timely manner.

In addition, a need exists for an ATE that comprises hardware-based traffic capture modules that collect and monitor data being exchanged between a tester and a device under test (DUT) in order to collect valuable information regarding the state of the tester over time and the data being exchanged between the tester and the DUT over time.

In one embodiment, a method for monitoring a communication link between a device under test (DUT) and automated test equipment is disclosed. The method comprises monitoring data traffic associated with testing a DUT using a protocol analyzer module, wherein the data traffic comprises a flow of traffic between the DUT and a protocol core of a programmable logic device, wherein the protocol analyzer module is integrated within the programmable logic device, wherein the programmable logic device is controlled by a system controller and is operable to generate commands and data to test the DUT, and wherein the protocol core is operable to generate signals to communicate with the DUT using a protocol associated with the DUT. The method further comprises saving results associated with the monitoring in a memory associated with the protocol analyzer module and transmitting the results upon request to an application program executing on the system controller.

In a different embodiment, an apparatus for diagnosing a cause of failure using automated test equipment (ATE) is disclosed. The apparatus comprises a computer system comprising a system controller, wherein the system controller is communicatively coupled to a site module board comprising a tester processor and a programmable logic device, wherein the system controller is operable to transmit instructions to perform a test on a device under test (DUT) to the tester processor and the programmable logic device. Further, the programmable logic device is communicatively coupled to the DUT and operable to generate commands and data for executing the test on the DUT, and wherein the programmable logic device comprises a protocol analyzer module programmed on the programmable logic device and operable to: (a) monitor data traffic associated with testing the DUT, wherein the data traffic monitored comprises a flow of traffic between the DUT and a protocol core programmed on the programmable logic device; (b) compress data sequences in the flow of traffic and selectively discard less critical data from the flow of traffic; (c) store results associated with monitoring the data traffic in a memory associated with the protocol analyzer module; and (d) transmit the results upon request to a tester application program executing on the system controller.

In one embodiment, a tester comprises a system controller for controlling a test program for testing a plurality of DUTs and a plurality of modules operable to interface with and test the plurality of DUTs, the plurality of modules coupled to the system controller, wherein each module comprises a site module board, and wherein each site module board comprises: (a) a tester processor coupled to communicate with the system controller to receive instructions and data therefrom in accordance with the test program; and (b) a plurality of programmable logic devices coupled to the tester processor, each programmable logic device comprising a protocol core and operable to generate test data for application to a respective DUT, further operable to receive and compare test data generated by the respective DUT, and further yet the protocol core of each programmable logic device operable to be programmed to communicate with the respective DUT in a communication protocol compatible with the respective DUT, and wherein each of the programmable logic devices comprise a protocol analyzer module, wherein the protocol analyzer module is programmed on the programmable logic device and operable to: (i) monitor data traffic associated with testing the DUT, wherein the data traffic monitored is between the DUT and the protocol core; (ii) perform compression on data sequences in the data traffic and selectively discard less critical data from the data traffic; (iii) store results associated with monitoring the data traffic in a memory associated with the protocol analyzer module; and (iv) transmit the results upon request to a tester application program executing on the system controller.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

Figure 1:
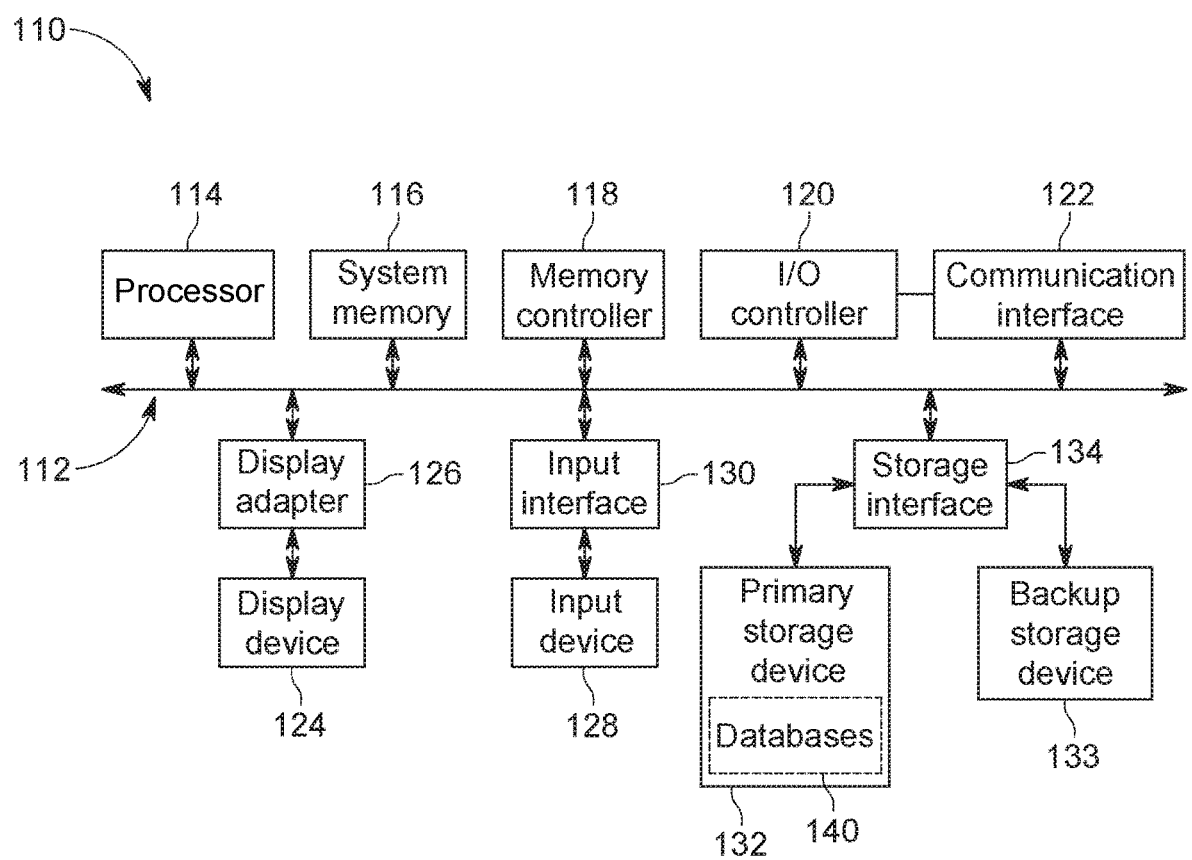
FIG. 1 is a computer system on which embodiments of the automated test system of the present invention can be implemented in accordance with one embodiment of the present invention.

In the figures, elements having the same designation have the same or similar function.

DETAILED DESCRIPTION OF THE INVENTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "configuring," "providing," "executing," "transmitting," "obtaining," "implementing," "programming," "allocating," "associating," "setting," "accessing," "retrieving," "saving," "capturing," "generating," "completing," "monitoring," "controlling," "determining," "identifying," "caching," "maintaining," "comparing," "removing," "reading," "writing," or the like, refer to actions and processes (e.g., flowchart 1000 of FIG. 10) of a computer system or similar electronic computing device or processor (e.g., system 110 of FIG. 1). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

FIG. 1 is a block diagram of an example of a tester control system 110 capable of incorporating a protocol analyzer within the tester hardware. For example, system 110 may incorporate a protocol analyzer as a discrete module within the tester hardware or the protocol analyzer may be programmed onto FPGA devices within the tester control system alongside a third party IP core. Tester control system 110 broadly represents any single or multi-processor computing device or system capable of executing computer-readable instructions. Examples of control system 110 include, without limitation, workstations, laptops, client-side terminals, servers, distributed computing systems, handheld devices, or any other computing system or device. In its most basic configuration, control system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments control system 110 may include both a volatile memory unit (such as, for example, system memory 116) and a non-volatile storage device (such as, for example, primary storage device 132).

Tester control system 110 may also include one or more components or elements in addition to processor 114 and system memory 116. For example, in the embodiment of FIG. 2A, control system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of control system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of control system 110, such as processor 114, system memory 116, communication interface 122, display adapter 126, input interface 130, and storage interface 134.

Communication interface 122 broadly represents any type or form of communication device or adapter capable of facilitating communication between example control system 110 and one or more additional devices. For example, communication interface 122 may facilitate communication between control system 110 and a private or public network including additional control systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between control system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow control system 110 to engage in distributed or remote computing. For example, communication interface 122 may receive instructions from a remote device or send instructions to a remote device for execution.

As illustrated in FIG. 1, control system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1, control system 110 may also include at least one input device 128 coupled to communication infrastructure 112 via an input interface 130. Input device 128 generally represents any type or form of input device capable of providing input, either computer- or human-generated, to control system 110. Examples of input device 128 include, without limitation, a keyboard, a pointing device, a speech recognition device, or any other input device.

As illustrated in FIG. 1, control system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of control system 110.

In one example, databases 140 may be stored in primary storage device 132. Databases 140 may represent portions of a single database or computing device or it may represent multiple databases or computing devices. For example, databases 140 may represent (be stored on) a portion of control system 110 and/or portions of example network architecture 200 in FIG. 2 (below). Alternatively, databases 140 may represent (be stored on) one or more physically separate devices capable of being accessed by a computing device, such as control system 110 and/or portions of network architecture 200.

Continuing with reference to FIG. 1, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into control system 110. For example, storage devices 132 and 133 may be configured to read and write software, data, or other computer-readable information. Storage devices 132 and 133 may also be a part of control system 110 or may be separate devices accessed through other interface systems.

Many other devices or subsystems may be connected to control system 110. Conversely, all of the components and devices illustrated in FIG. 1 need not be present to practice the embodiments described herein. The devices and subsystems referenced above may also be interconnected in different ways from that shown in FIG. 1. Control system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into control system 110. All or a portion of the computer program stored on the computer-readable medium may then be stored in system memory 116 and/or various portions of storage devices 132 and 133. When executed by processor 114, a computer program loaded into control system 110 may cause processor 114 to perform and/or be a means for performing the functions of the example embodiments described and/or illustrated herein. Additionally or alternatively, the example embodiments described and/or illustrated herein may be implemented in firmware and/or hardware.

Figure 2:
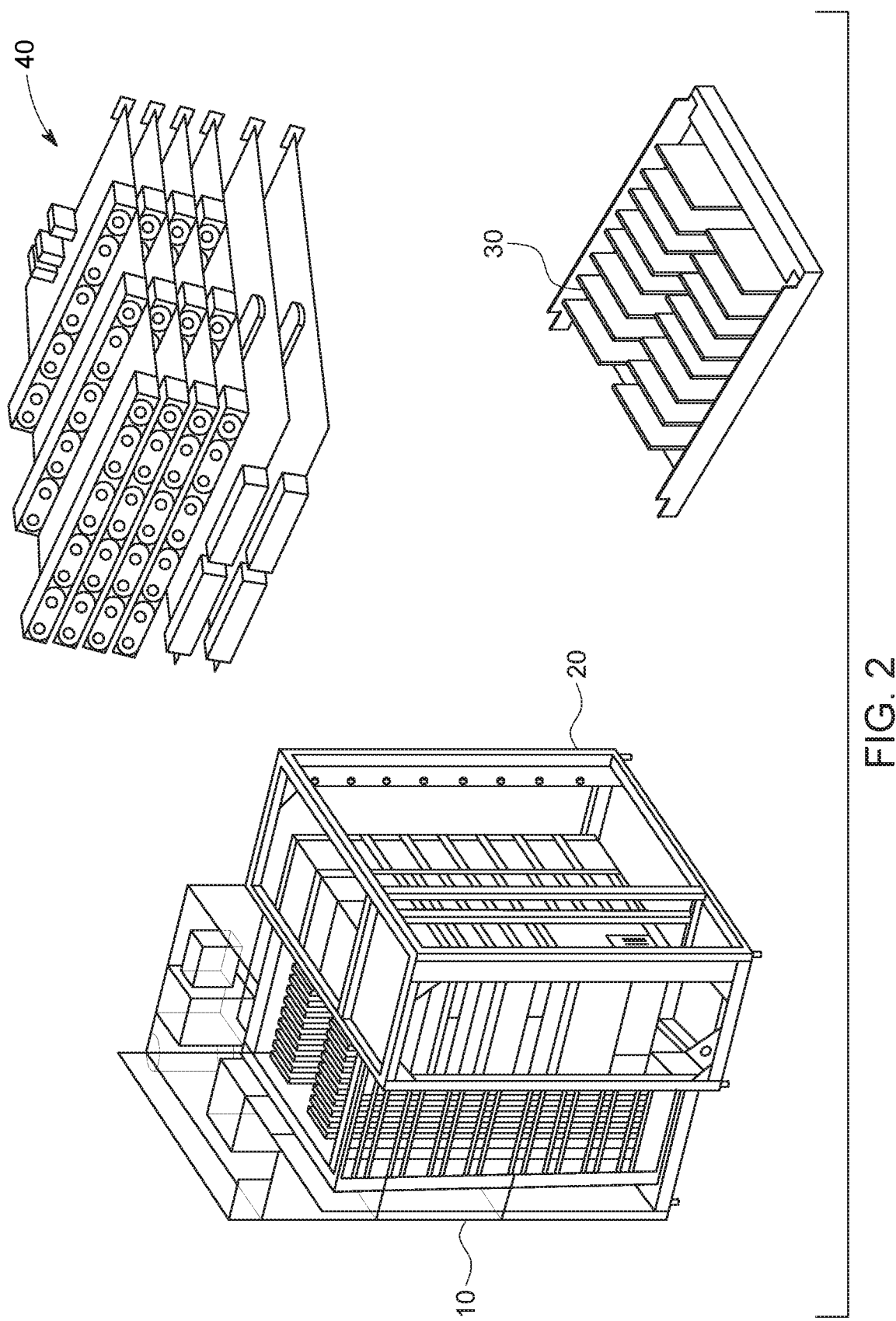
FIG. 2 illustrates a typical testing environment in which DUTs are placed into a controlled environmental chamber.

A Smart and Efficient Protocol Logic Analyzer Configured within Automated Test Equipment (ATE) Hardware FIG. 2 illustrates a typical testing environment in which DUTs may be placed into a controlled environmental chamber 10. The DUTs are connected to tester slices of a test head 20. Many DUTs can be connected to a single tester slice 40. The tester slices contain the test circuitry, which performs tests on the DUTs in accordance with a test plan. There can be many tester slices per test head 20. The DUTs are placed into trays 30 when inserted into the oven 10. In a typical environmental chamber, the plurality of tester slices operate in lock step executing the same test plan on the plurality of DUTs. Further, the test head is typically controlled by a single controller computer system (e.g. tester control system 110) that is directly connected to the test head and, in this fashion, controls all of the slices of the test head 20. The system controller 110 is typically operated by a single user executing a single test plan on the DUTs. As will be described further below, each tester slice comprises FPGAs onto which the protocol analyzer of the present invention can be programmed. For example, in one embodiment, the FPGAs can be programmed with the protocol analyzer that will enable compression of data being exchanged between the FPGAs and the connected DUTs and selective capture of the critical data in order to reduce the amount of memory needed for collection. In a different embodiment, the protocol analyzer may be programmable on a discrete programmable logic device within the tester hardware.

In addition, the FPGAs on each of the tester slices may also comprise traffic capture modules and debugging modules. For example, the FPGAs can be programmed with logic and buffers that collects information pertaining to the state of the FPGAs and the data being exchanged between the FPGAs and any connected DUTs.

Figure 3:
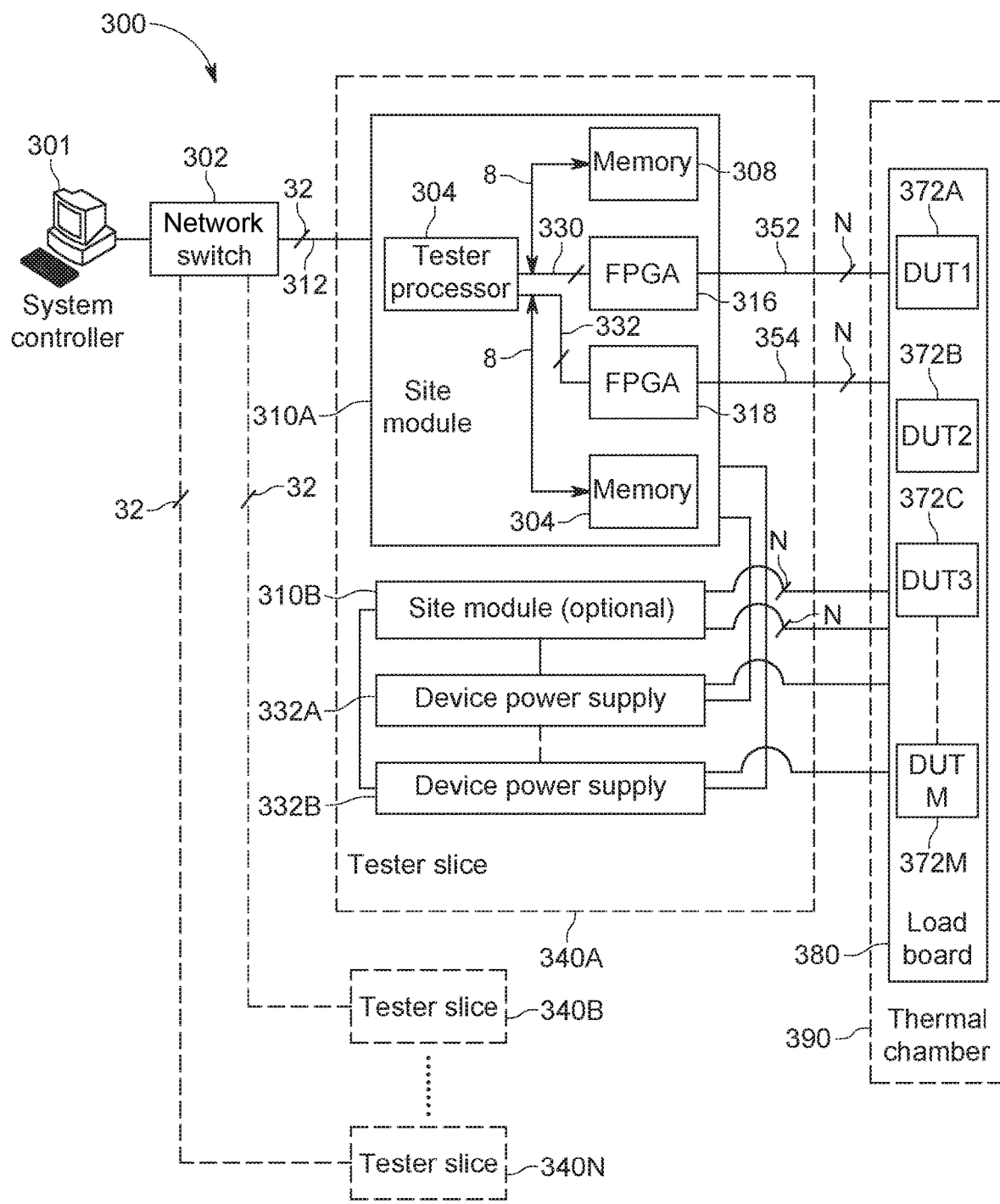
FIG. 3 is a schematic block diagram illustrating an exemplary embodiment of a tester slice and its interconnections with the system controller and the DUTs.

FIG. 3 is a schematic block diagram illustrating an exemplary embodiment of a tester slice and its interconnections with the system controller and the DUTs.

Referring to FIG. 3, each tester slice comprises site modules. The site modules, in one embodiment, can be mechanically configured onto tester slices 340A-340N, wherein each tester slice comprises at least one site module. In certain typical embodiments, each tester slice can comprise two site modules and two device power supply boards. In other embodiments, the tester slice may comprise more or fewer site modules and/or power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. Network switch 302 can be connected to each of the site modules with a 32 bit wide bus.

In one embodiment, the system controller 301 may be a computer system, e.g., a personal computer (PC) that provides a user interface for the user of the ATE to load the test programs and run tests for the DUTs connected to the ATE 300. The Advantest Stylus Operating System is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 301 can be connected to the site module boards 310A-310B through a network switch, such as an Ethernet switch. In other embodiments, the network switch may be compatible with a different protocol such as Fibre Channel, 802.11 or ATM, for instance.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3 is controlled by the tester processor 304. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 304 respectively. The memory modules can be coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, the load board needs to be designed so as to have connectors specific to the protocol being used by the DUT. It should be noted that the DUTs can be connected to the FPGAs in a myriad of ways and are not limited to using a load board.

It should be noted that FIG. 3 only illustrates an exemplary embodiment of a tester slice. Further, note that embodiments of the present invention are not limited to only the type of tester slices shown in FIG. 3. Embodiments of the present invention can include many different types of tester slices and primitives. Each tester slice will, however, comprise FPGAs onto which the protocol analyzer and traffic capture modules of the present invention can be programmed regardless of the configuration of the tester slice.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

The tester processor 304 is connected to and can communicate with the system controller 302 over bus 312. In one embodiment, tester processor 304 communicates with each of the FPGA devices 316 and 318 over a separate dedicated bus (e.g., 330 and 332 respectively). In one embodiment, tester processor 304 can control the testing of the DUTs 372A-372N transparently through the FPGAs with minimal processing functionality allocated to the FPGA devices. In this embodiment, the data traffic capacity of buses 330 and 332 can be exhausted rapidly because all the commands and data generated by the tester processor need to be communicated over the bus to the FPGA devices. In other embodiments, the tester processor 304 can share the processing load by allocating functionality to control the testing of the DUTs to the FPGA devices. In these embodiments, the traffic over buses 330 and 332 is reduced because the FPGA devices can generate their own commands and data.

In one embodiment, each of the FPGA devices, e.g., 316 and 318 is connected to its own dedicated memory block, e.g., 308 and 304. These memory blocks can, among other things, be utilized to store the test pattern data that is written out to the DUTs. In one embodiment, each of the FPGA devices can comprise two or more instantiated FPGA tester blocks (not shown) with functional modules for performing functions including implementation of communicative protocol engines and hardware accelerators.

Further, each of the DUTs 372A-372M in the system can be connected to a dedicated instantiated FPGA tester block in a "tester per DUT" configuration, wherein each DUT gets its own instantiated tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block within the FPGA and be running a different test program.

The architecture of the embodiment of the present invention depicted in FIG. 3 has several advantages. First, it eliminates the need for protocol-specific bus adapter sockets and cards in the system because the communication protocol modules can be programmed directly on a configurable interface core (or IP core) of the instantiated FPGA tester blocks within the FPGA devices. The instantiated tester blocks can be configured to communicate with the DUTs in any protocols that the DUTs support. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 301 without any kind of hardware interactions. An FPGA will typically include an IP core that is programmable to provide functionality of one or more protocol based interfaces for a DUT and is programmable to interface with the DUT. For example, the FPGAs 316 and 318 in the ATE apparatus will include an interface core that can be configured with the PCIe protocol to test PCIe devices initially and subsequently reconfigured via a software download to test SATA devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs can be configured to run more than one communicative protocol, wherein these protocols also can be downloaded from system controller 301 and configured through software. In other words, each FPGA implements custom firmware and software images to implement the functionality of one or more PC based testers in a single chip. The required electrical signaling and protocol-based signaling is provided by on-chip IP cores in the FPGAs. As mentioned above, each FPGA instantiated tester block is programmable with pre-verified interface or IP cores. This ensures compliance and compatibility according to a given interface standard. The programmable nature of the FPGA is utilized to optimize flexibility, cost, parallelism and upgradeabilty for storage testing applications from SSDs, HDDs and other protocol based storage devices.

For instance, an instantiated FPGA tester block within FPGA 316 can be configured to run the PCIe protocol while a different instantiated FPGA tester block within the same FPGA 316 can be configured to run the SATA protocol. This allows the tester hardware to test DUTs supporting different protocols simultaneously. FPGA 316 can now be connected to test a DUT that supports both PCIe and SATA protocols. Alternatively, it can be connected to test two different DUTs, one DUT supporting the PCIe protocol and the other DUT supporting the SATA protocol, where each instantiated functional module within the FPGA is configured with a protocol to test the respective DUT it is connect to.

In one embodiment, the interface or IP core in the FPGA may be acquired from a third party vendor but may require some customization to be compatible with the embodiments described herein. In one embodiment, the interface core provides two functions: a) wraps storage commands into a standard protocol for transmission over a physical channel; and 2) is the electrical signal generator and receiver.

Figure 4:
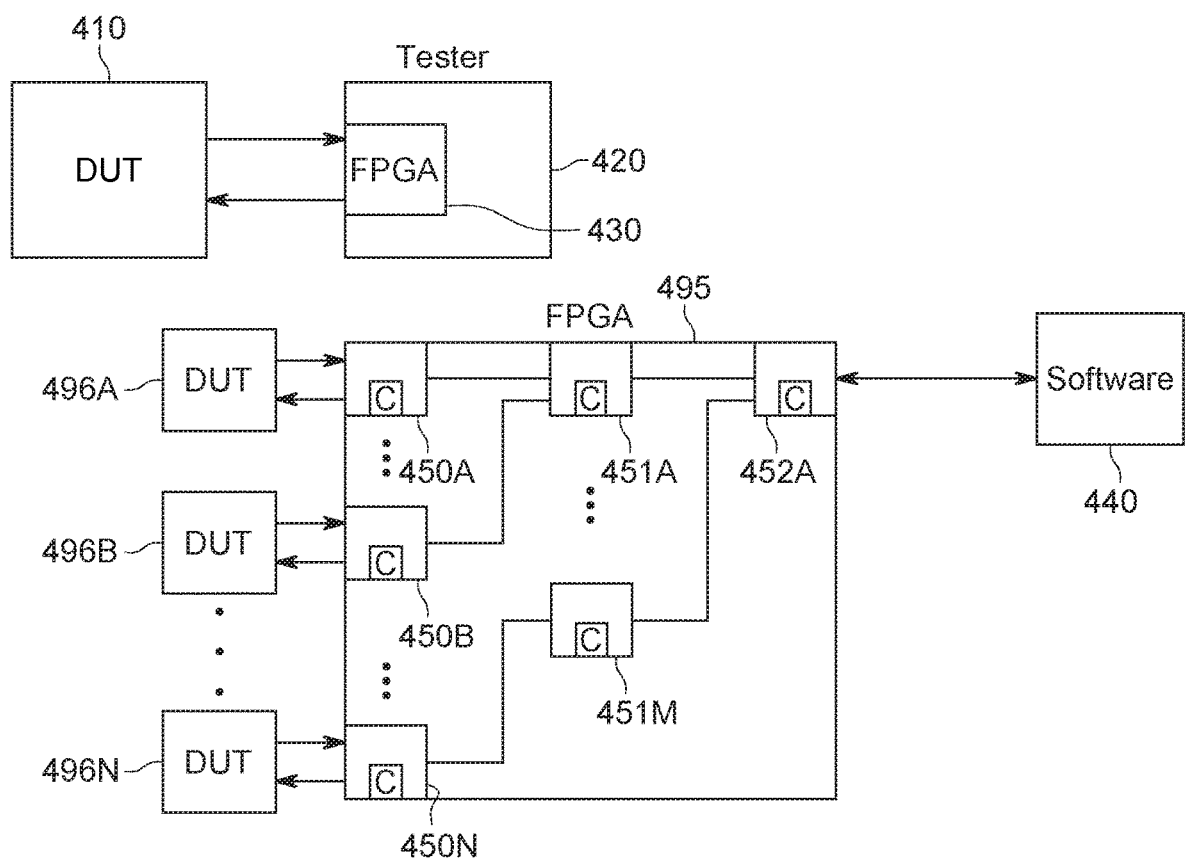
FIG. 4 is a high-level block diagram illustrating the manner in which the traffic capture modules of the present invention collect diagnostic information pertaining to automated testing in accordance with an embodiment of the present invention.

FIG. 4 is a high-level block diagram illustrating the manner in which the traffic capture modules of the present invention collect diagnostic information pertaining to automated testing in accordance with an embodiment of the present invention.

As shown in FIG. 4, each tester 420 (or tester slice) comprises at least one FPGA 430 that is in communication with at least one DUT 410. As shown in FIG. 3, typically each FPGA will communicate with multiple DUTs.

Embodiments of the present invention add traffic capture logic modules and buffers to the FPGA, e.g., 450A, 450B, . . . 450N, 451A . . . 451M and 452A, in order to collect information such as the state of the tester 420 over time (including the FPGA 430) and data being exchanged between the tester 420 and the DUT over time. Using traffic capture modules and buffers allows the tester to advantageously collect information pertaining to device failure within modules and buffers inside the tester firmware itself. It should be noted that the invention herein is not limited to FPGAs, the capture modules of the present invention can be programmed onto other types of programmable logic devices as well.

Currently, debug tools are being developed in the testing industry for easier interpretation of collected data. The tools are mostly software-based and are geared towards organizing collected data in a context relevant manner, which allows the expert to more easily identify issues. However, these approaches are still fairly labor intensive because they require an engineer to manually review testing logs and files.

Embodiments of the present invention advantageously add analysis capability within the logic modules of the hardware, e.g., inside the FPGA. For example, the capture logic modules and buffers can be programmed to monitor for device failure precursors. The failure precursors provide an indication regarding DUTs that are potentially going to fail. Previously, an engineer would have to review several logs to determine information regarding impending device failure. Embodiments of the present invention advantageously build in the capability to identify and alert the engineer regarding potential device failures within the firmware. The traffic capture modules analyze the debug data in real time. Further, the traffic capture modules identify suspicious conditions and flag them upon logging for a person to examine or software to review at a later time.

In one embodiment, the traffic capture and debug tools of the present invention comprise a collection of FPGA logic (firmware) and software-based tools that advantageously work together help identify causes of device failure. The logic modules programmed onto the FPGAs monitor and capture: (1) traffic or proxies of traffic exchanged between the tester and respective DUTs; (2) configuration commands used to configure the tester or the respective DUTs; and (3) states with the tester. Further, during the testing process, occasionally errors or unforeseen behavior may occur within the FPGA, which can be captured by the capture modules. Additionally, logic within the capture modules also check for failure precursors and flag them as they get logged. The automated software-based debugging tools included within software 440 can extract the capture results from the capture modules, e.g., 450A-450N, 451A-451M, etc., organize the data, and display the root cause of the failure.

In a typical test configuration, the FPGA 430 will write a predetermined pattern to the DUT 410, read the pattern back from the DUT 410, and compare the two in order to determine if the DUT is functioning properly. As mentioned in reference with FIG. 3, each FPGA can be configured to execute a different protocol, e.g., the PCIe protocol and can further be configured to generate commands and data to test one or more connected DUTs.

The capture modules of the present invention allow the exchange of data and commands between the FPGAs and the DUTs to be captured and monitored to check for aberrations. An FPGA 430 can communicate with one or multiple DUTs at the same time. Accordingly, each FPGA may comprise multiple capture modules at the first stage, e.g., 450A-450N, each of which is configured to communicate with a discrete DUT, e.g., DUT 496A, DUT B496B ... DUT 496N. The information gathered from the DUTs can flow upstream through one or more stages till it is communicated to the software 440.

For example, the FPGA illustrated in FIG. 4 comprises three stages. Data is communicated from the DUTs to the capture modules in the first stage, e.g., 450A-450N. Subsequently, the data flows through the second stage comprising exemplary capture modules 451A-451M. From there, the data passes through the final stage comprising capture module 452A before it is communicated to the software. It should be noted that embodiments of the present invention are not limited to a particular number of stages or a particular number of capture modules. An FPGA can comprise one or more stages, with each stage comprising one or more capture modules, depending on the complexity of the FPGA and the test to be performed. Typically, however, the data captured from the DUTs will be communicated upstream to the software 440 using multiple stages of capture modules and buffers.

The capture modules in each stage within the FPGA will typically have a different configuration from the capture modules in other stages. For example, the capture modules in the first stage, e.g., 450A-450N of the FPGA illustrated in FIG. 4 will be configured to communicate with and collect data from the DUT directly. The capture modules in the second stage, e.g., 451A-451M are configured to have properties similar to switches because they route the data collected from the DUTs to the software block 440. Finally, the capture modules in the third stage of FPGA 495 are configured to transfer the information gathered from the DUTs to the software module 440 and, further, to transfer data and commands downstream from the software 440 to the DUTs. Disseminating capture modules throughout the FPGA allows any errors or unforeseen behavior by the FPGA to be readily captured and analyzed.

In one embodiment, the capture cells can be used to convey information between the DUTs 496A-496N and the software 440. For instance, the software 440 can send commands and data downstream to the DUTs through the chain of capture modules. Further, the DUTs can send responses to the software 440 upstream through the chain of capture modules. The capture modules are programmable and have the necessary logic to identify and flag any error condition that may occur during any stage of the communication. For example, while transmitting information upstream, capture module 451M may encounter an error condition. Capture module 451M may contain logic circuitry to determine whether the error condition is related to the DUT it received the information from or whether the error is related to the switch programmed into capture module 451M.

Alternatively, capture module 451M may be programmed to analyze the data received from a connected DUT, e.g., 469N, and identify a device failure precursor. In other words, capture module 451M may use the data gathered from the DUT to indicate that the DUT will fail imminently. Capture module 451M may then flag an error condition or a potential error condition and relay information pertaining to the error to software 440 so the user can be alerted.

In one embodiment, capture modules may also contain logic circuitry and be programmed to analyze the information captured and identify a cause of error. For example, the capture module may be programmed with a rule checker that is run on the information collected. In other words, the rule-checker can parse through all the failure related information captured to identify some possible causes of the failure by running a set of rules on the information captured.

In one embodiment, there may be several different types of capture logic modules programmed into the FPGA, wherein each capture module serves a different purpose.

For example, if the DUTs are PCIe devices, one or more of the capture modules can comprise Transaction Layer Packet (TLP) capture modules. Transaction layer packets are exchanged between a host and a client (or between a tester and a device under test) using the PCIe protocol and the capture module in the FPGA may, for example, capture these TLPs for further inspection and to collect failure related information.

Another type of capture module may be programmed as a Link Training Status State Machine (LTSSM) Capture module. The LTSSM capture module is programmed to comprise FPGA logic that logs LTSSM events. The LTSSM defines the states machine that the physical and link layer states in the PCIe protocol go through in order to communicate from one end point to another. These states can be captured and analyzed using capture module logic within an FPGA. For example, the capture module may be able to identify and capture the different states the IP core of the FPGA is transitioning through in the execution of the PCIe protocol. If there is a failure in transitioning to an expected state or if a failure occurs while processing a particular state, the capture module will capture the information and transmit it to software 440 for further analysis. Alternatively, in one embodiment, the capture module may contain further logic circuitry to analyze the error condition, e.g., using a rule-checker and determine the root cause of error. The diagnostic information can then be transmitted to the software 440 to relay to the user.

Another type of capture module can comprise a NAK Capture module. NAK is an abbreviation for negative acknowledgement or not acknowledged. It is a signal used in digital communications to ensure that data is received with a minimum of errors. One type of capture module comprises logic that logs NAK events.

In one embodiment, a capture module can comprise an Activity Capture module. An Activity Capture module comprises FPGA logic that logs activity detection events. If there is any activity detected on the incoming or outgoing lines, the activity detection capture module will log such events to present to the user.

In one embodiment, a capture module can comprise an Equalization Capture module. The Equalization Capture module logs equalization events. Equalization can be performed for the PCIe protocol by adjusting the signals on a transmitter and receiver so that the integrity of the data communicated can be maintained. The capture module will monitor the PCIe IP core to determine the manner in which equalization is progressing. In other words, the capture module will monitor the IP core to determine which settings are being requested and used for purposes of equalization and whether they are being accepted. If there is suspicious activity or any illegal values being set, the activity can be captured and flagged and reporter to the user through software module 440.

In one embodiment, a capture module can comprise a Completion Capture module. The Completion Capture module is designed to log a latency between a read request and completion of the read.

In one embodiment, a capture module can comprise an Enhanced Advanced Error Reporting (AER) Capture module. This capture module comprises logic that reports the number of occurrences of Advanced Error Reporting (AER) events. Advanced Error Reporting is a feature of the PCIe protocol and, therefore, this would be a type of capture module programmable in an FPGA running the PCIe protocol.

In one embodiment, a capture module can comprise a Register Access Capture module. A Register Access Capture module comprises FPGA logic that logs the read/write access of control and status registers.

In one embodiment, a capture module can comprise a Traffic Filtering Capture module. A Traffic Filtering Capture module selectively reduces the amount of traffic that the TLP Capture modules will collect. Because buffer space inside the FPGA is limited, a Traffic Filtering Capture module may be used in conjunction with the TLP Capture module to filter or selectively choose a subset of the packets that would be of most interest to the user for diagnostic purposes.

In one embodiment, a capture module can comprise a Traffic Triggering Capture module. A Traffic Triggering Capture module comprises FPGA logic that stops a capture based upon a detected event. In other words, if a user wanted to stop capturing traffic after detecting a particular condition, a Traffic Triggering Capture module can be programmed onto the FPGA.

In one embodiment, a capture module can comprise an Enhanced Data Logging Capture module. This capture module comprises FPGA logic that compares the expected versus received data and displays the results to the user by sending them to software block 440.

In another embodiment, a capture module can comprise an LTSSM Rules Checking module. This type of capture module in PCIe devices comprises FPGA logic to determine if the LTSSM state transitions are normal. The LTSSM Rules Checking capability can also be programmed into post-processing software (e.g., within software 440) in cases where it may be more efficient to perform rules-checking using software rather than hardware modules.

Figure 5:
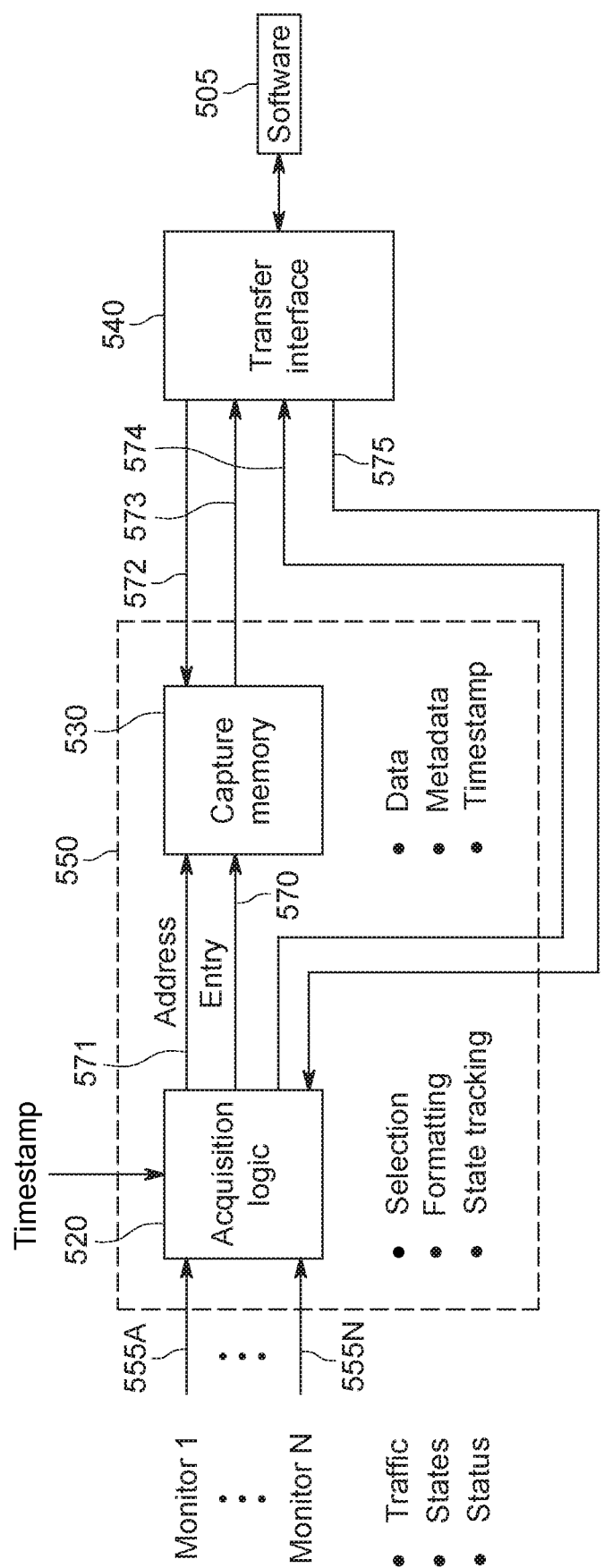
FIG. 5 is a block diagram illustrating the manner in which the traffic capture modules of the present invention are programmed in accordance with an embodiment of the present invention.

FIG. 5 is a block diagram illustrating the manner in which the traffic capture modules of the present invention are programmed in accordance with an embodiment of the present invention. It should be noted that the Capture Block 550 illustrated in FIG. 5 is exemplary. Different types of capture modules may be programmed or configured differently depending on their function.

A typical capture module, e.g., capture module 550 can comprise one or more inputs. For example, each of the inputs, Monitor 1 555A through Monitor N 555N is a discrete input relating to data traffic, states or status that the capture block is programmed to monitor.

The acquisition logic 520 of the capture block selects and captures the information regarding the traffic, states or status and formats them in a desirable order (based on the programming) so that it can be saved in capture memory 530. The acquisition logic block 520 can also selectively capture the desired data. In other words, the acquisition logic block may be programmed to gather only a subset of data inputted through the monitor signals 555A-555N. Certain configuration bits can be programmed into the acquisition block logic that specifies how much of the incoming data should be captured, e.g., in certain instances only the headers of the incoming packets may need to be captured.

In one embodiment, the capture module may only capture certain types of data, e.g., data packets with a particular bit configuration. The acquisition logic 520 can be programmed to selectively capture only the desired data packets while ignoring the rest. In one embodiment, a pre-filtering module (not shown) can be added to the capture block that precedes the acquisition logic block 520 and selectively filters the incoming data.

As a result, the acquisition logic block 520 has access to the format of the data collected. Further, the acquisition logic block 520 can also perform state-tracking, e.g., for LTSSM events. As noted above, the LTSSM defines the states machine that the physical and link layer states in the PCIe protocol go through in order to communicate from one end point to another.

The information acquired by the acquisition logic block 520 can be transferred to the capture memory 530, wherein each entry 570 stored in the memory 530 is accompanied with an address 571. As mentioned earlier, the acquisition logic block 520 has access to the format of the monitored information and can use this to create entries to be stored within memory 530. Typically, the acquisition logic 520 will determine the address 571 within the memory 530 to save the information. In one embodiment, discrete information is captured during each clock cycle and an entry into memory 530 is created for each clock cycle. For example, a TLP Capture block may capture a TLP packet each clock cycle and create a new entry in the memory module for each TLP packet. On the other hand, since each TLP packet can comprise 256 bits, each TLP packet may be stored across multiple entries in the capture memory 530.

In different embodiments, certain types of data may take multiple clock cycles to capture. Accordingly, an entry is created in memory 530 for such types of data when all the data regarding a particular event has been collected.

In one embodiment, the acquisition logic block 520 may comprise a simple state machine that transitions through a sequence of states to format the data from the monitors to generate entries and addresses to be stored in the memory 530. The state machine further increments the address for the next entry. The state machine may also have additional states depending on the type of capture module. For example, a Traffic Triggering capture block may have additional states related to the triggering of an event.

In one embodiment, memory 530 can comprise a circular buffer to store the entries and accompanying addresses received from the acquisition logic module 520. The number of entries and their frequency depends on the type of capture block. For example, a capture module like the TLP capture may need to store an entry in memory 530 for every transaction layer packet. On the other hand, a capture block that is monitoring states may only create an entry when a state change is detected. Typically, a timestamp is associated with each entry when it saved in the capture memory 530. This allows the data to be sorted easily. This is especially convenient after data from the various capture modules in the FPGA have been transferred to the software 505. The time-stamped data can be sorted using the time-stamps, which makes it easy for an engineer to view the results in time-order and diagnose any problems. In addition to the data and the time-stamp, in some cases metadata may also be stored with the entry containing additional details regarding the event. For example, if the capture module stores information pertaining to state change events, then metadata regarding the type of state change event may be saved with each entry in the memory module 530.

In one embodiment, each capture module communicates the information collected to the tester software 505 using transfer interface 540. Typically, each capture module will comprise a transfer interface block to communicate the captured data to the software 505. The transfer interface block 540 can access the capture memory 530 using address and data lines, 572 and 573, respectively. The status signal(s) 574 provides information to the transfer interface regarding the location in memory 530 where the information is stored and any further information regarding the format of the data. The control signal(s) 575 allow the transfer interface block 540 to control the data flow to the software 505 and set any other preferences regarding controlling the data flow to the software 505.

In one embodiment, where a capture module is merely capturing status information, instead of a capture memory 530, the buffer would typically only comprise registers for storing the status information.

In one embodiment, the capture module can be programmed to determine time lags between events. For example, the capture module may be a Completion Capture module that logs the latency between a read request and the completion of the read request. Accordingly, one of the signals being monitored (e.g., using monitor 1 555A) will be a read request while another signal being monitored (e.g., using monitor N 555N) by the capture module will be a completion packet sent in response to completing the read request. The capture module can use time-stamps to monitor the time lag between the read-request and the completion or determine if there was no completion at all. The acquisition logic 520 of the capture module will typically need to be programmed with information from the specification, e.g., the PCIe specification regarding typical read request times and the maximum time beyond which a read-request failure needs to be flagged. The capture module can record information regarding the read-request times or any failure information in the capture memory 530 and report it out to the user through software 505.

In one embodiment, the user has control over how many and what type of capture modules should be programmed into a particular FPGA. Because FPGAs can easily be reprogrammed, a user is not necessarily limited to a fixed configuration. For example, a user may choose a different number and type of capture module based on the type of protocol being emulated on the FPGA or based on the type of design within which the FPGA is being used. The number and type of capture modules to be added to any particular FPGA can be specified at a command line interface when the designer is building the bit-files to be programmed into the FPGA. In other words, appropriate selection of certain build options when programming the FPGA allows the user to easily select the number and type of capture modules to include in a design.

Figure 6:
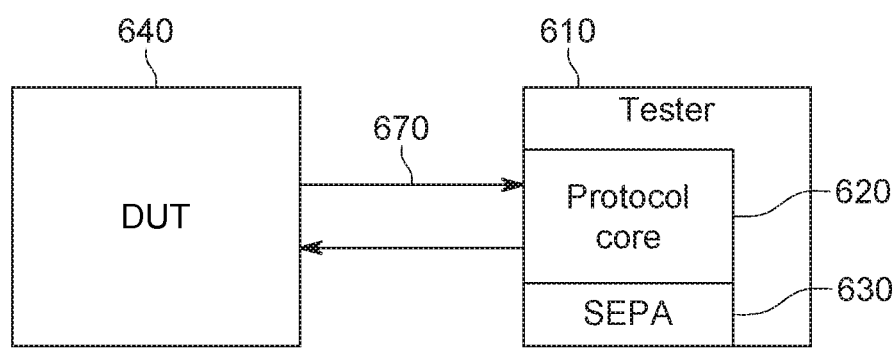
FIG. 6 is a high-level block diagram illustrating the manner in which the smart and efficient protocol analyzer (SEPA) of the present invention collects information pertaining to automated testing in accordance with an embodiment of the present invention.

FIG. 6 is a high-level block diagram illustrating the manner in which the smart and efficient protocol analyzer (SEPA) of the present invention collects information pertaining to automated testing in accordance with an embodiment of the present invention.

As mentioned previously, protocol analyzers are a passive diagnostic tool that collect, organize, and display protocol traffic occurring on a serial link. Protocol analyzers use large amounts of memory to store the traffic, typically many gigabytes. The stored traffic represents one of two forms of data: raw and protocol. In raw mode the protocol analyzer saves the serial data bit for bit in its memory. In protocol mode the protocol analyzer first decodes and descrambles the data prior to saving the data to memory. Some protocol analyzers can filter "idle" traffic. Idle traffic refers to data that conveys no information. For example, in PCI Express idle traffic is scrambled zeros. After descrambling, idle traffic is discarded to conserve on memory usage. Despite having the ability to discard idle traffic, conventional protocol analyzers still require considerable amounts of memory to store all the data traffic.

There are many situations where it is useful to have a standard protocol analyzer but constraints, including financial, memory and spatial constraints, limit the ability to have one. One application where this is the case is within a solid state device (SSD) tester.

In one embodiment, a full protocol analyzer could be integrated into a SSD tester, wherein the protocol analyzer could be programmed using the FPGA and memory resources within the tester. However, this would require adding a large amount of FPGA logic and memory resources to the SSD tester. Accordingly, a need exists for a protocol analyzer integrated into ATE, e.g., a SSD tester to be more selective in the information that is collected.

Embodiments of the present invention use a pared down version of a protocol analyzer that is built into the tester itself. For example, the protocol analyzer of the present invention can comprise a module programmed onto an FPGA. The tester may be an SSD tester or any other type of tester that connects with and tests DUTs. For example, FIG. 6 illustrates a smart and efficient protocol analyzer (SEPA) 630 that is built into the tester 610 and can monitor signals communicated between DUT 640 and the tester 610. The protocol analyzer of the present invention advantageously uses compression and selection to reduce the amount of memory it needs for collection and analysis of data. Accordingly, it provides a significant advantage over conventional protocol analyzers that require extensive amounts of memory storage. Further, the protocol analyzer can be built directly into a tester, thereby, saving on cost and space required for a conventional protocol analyzer.

It should be noted that the smart and efficient protocol analyzer of the present invention offers much of the functionality of a protocol analyzer while also using compression and selection to reduce the amount of memory it needs for collection. For example, the protocol analyzer would monitor data and command sequences being exchanged on link 670 between the tester and the DUTs. Embodiments of the present invention enable monitoring sequences that are identical to be stored as a single instance with a repeat count that keeps track of the number of times the sequence was communicated. As a result, considerable memory savings result because the protocol analyzer is able to intelligently and advantageously determine the information of interest and save and organize it in a manner that allows the user to re-create the entire data sequence if needed. Further, because the protocol analyzer of the present invention does not require considerable memory resources like a conventional protocol analyzer, it can be programmed onto an FPGA. An FPGA would have access to a much smaller memory than a conventional protocol analyzer.

In one embodiment, the protocol analyzer will report on the critical information in the signals/packets that was transmitted and the number of times it was transmitted. Data that is less critical is discarded. Information regarding that data can be represented in a useful manner e.g., if the data falls within specification can be reported out succinctly. Alternatively, the report out only takes place when data falls outside of specification, which is more efficient.

As noted above, the interface or IP core 620 within the FPGAs of the tester core provide two functions: a) wraps storage commands into a standard protocol for transmission over a physical channel; and 2) is the electrical signal generator and receiver. Both the IP core 620 and the protocol analyzer 630 of the present invention can be programmed onto the FPGA (in addition to the capture modules discussed in relation to FIGS. 4 and 5). For example, the protocol core 620 may be a PCIe core that allows the PCIe core to be emulated on the FPGA and for the FPGA to generate commands and data that allow communication with and testing of PCIe DUTs.

In one embodiment, the protocol analyzer 630 can be programmed onto the same instantiated tester block on the FPGA as the protocol core 620. As mentioned above, the protocol core 620 is the electrical signal generator and receiver for the signals exchanged over communication link 670. The protocol analyzer 630 can be programmed to monitor the signals generated and received by the protocol core 620. In one embodiment, the protocol analyzer 630 and the protocol core 620 may be programmed into the same module on the FPGA or within separate modules of the same FPGA. This allows the protocol analyzer 630 to relatively easily monitor all the signals being transmitted and received by the protocol core 620.

A conventional protocol analyzer would typically comprise an interposer that needs to be situated in between the protocol core 620 of the tester and a connected DUT 640. Alternatively, a conventional protocol analyzer or oscilloscope may comprise probes that tap off the signaling wires comprising communication link 670. In both these cases, monitoring communication link 670 by inserting an interposer or probing the line affects the test results from the subtlest to more gross ways. Programming the protocol analyzer into the tester 610 advantageously avoids altering the test results because there is no need to physically probe or alter communication link 670 in any way.

Figure 7:
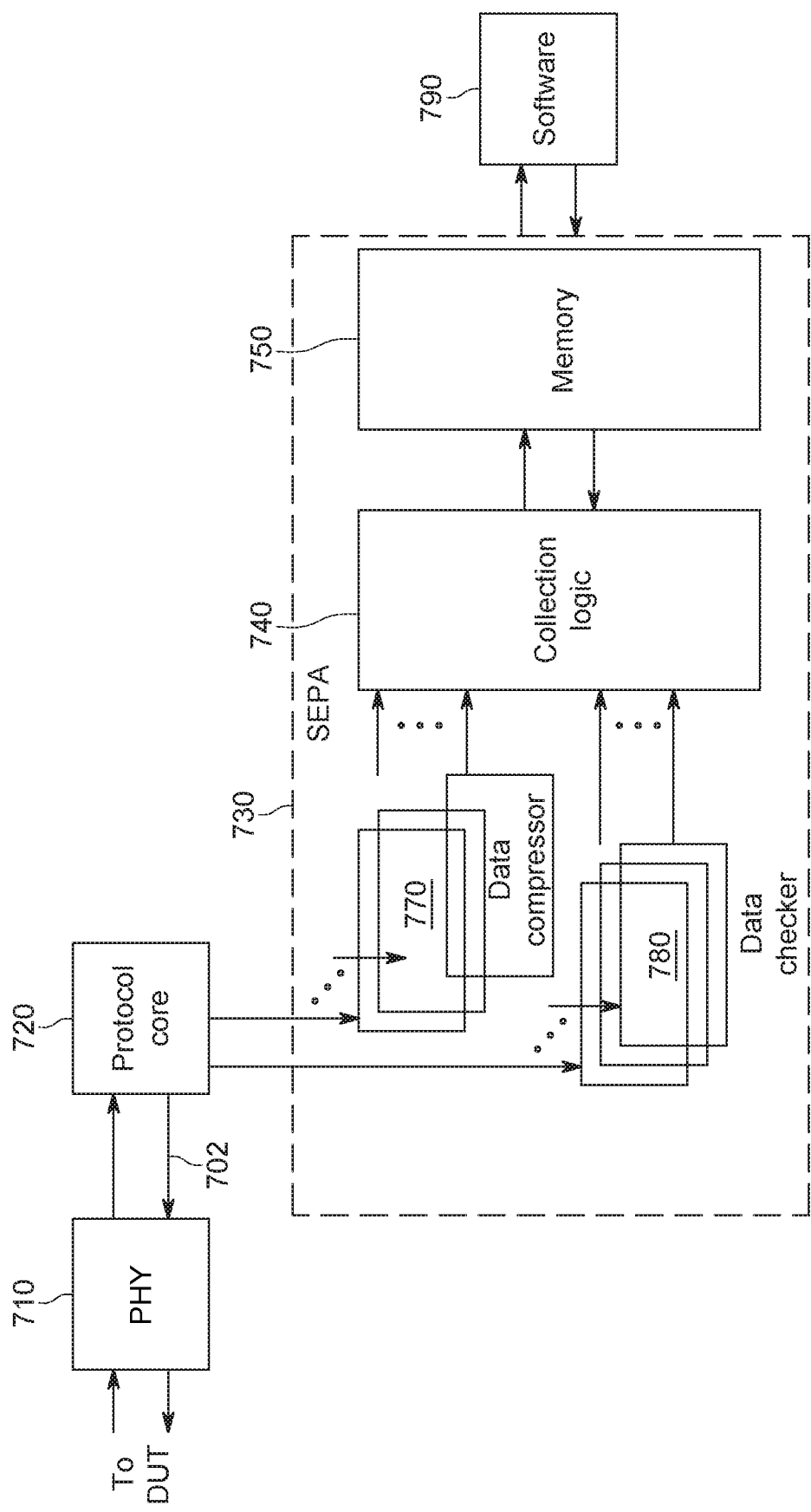
FIG. 7 is a block diagram illustrating the manner in which the protocol analyzer of the present invention reports data in accordance with an embodiment of the present invention.

FIG. 7 is a block diagram illustrating the manner in which the protocol analyzer of the present invention reports data in accordance with an embodiment of the present invention.

In one embodiment, the protocol analyzer 730 of the present invention comprises one or more data compressor modules 770 and one or more data checker modules 780. These modules may, for example, be programmed into the firmware of the FPGA and may contain memory or buffers to store incoming data. The data compressor module may compress data being exchanged on communication link 702 (the link between the protocol core 720 and the DUTs) by identifying identical sequences that repeat. For example, in the PCIe protocol, identical training sequences are sent repeatedly, sometimes in the thousands. The protocol analyzer can, in one embodiment, collect the first one and keep track of the number of times the identical sequence was transmitted (or received) by the protocol core 720. By comparison, conventional protocol analyzers collect all the sequences and optionally perform the compression when displaying the sequences to the user. The protocol analyzer, on the other hand, will advantageously only report out the first collected sequence and indicate the number of times it was transmitted.

In one embodiment, the data compressor module 770 operates in conjunction with collection logic 740 to store the repeating sequence and the accompanying count value to be reported out to the user through software 790. Software 790 may be tester application software executing on system controller 301.

In one embodiment, the protocol analyzer also performs selective discard. For example, in PCIe, repeated training sequences can be interrupted with a synchronizing pattern known as EIEOS. The PCIe specification dictates the frequency of how EIEOS is inserted between adjacent training sequences. The protocol analyzer can monitor and discard those patterns. Further, the protocol analyzer may create a report out only if the pattern appears to fall outside of specification mandates. By way of further example, PCIe also specifies how frequently SKP ordered sets are sent. In most debugging scenarios, SKP ordered sets are not pertinent. The protocol analyzer discards SKP ordered sets and, again, only provides reports if the result do not comply with specification requirements.

In one embodiment, one or more data checker modules 780 in the protocol analyzer can monitor for certain patterns, e.g., EIEOS and SKP, that appear on the communication link 702 while the collection logic 740 can perform the selective discard. In other words, the collection logic 740 can comprise logic circuitry to decide whether a pattern should be saved or discarded.

As shown in FIG. 7, the protocol analyzer comprises a data compressor 770 for identifying repeating sequences and performing data compression and also a data checker 780 for checking patterns to determine if a pattern is out of specification. In one embodiment, data compressor 770 and data check 780 are firmware modules that can be programmed directly on the FPGA. Further, the protocol analyzer can comprise collection logic 740 that stores the logic to decide whether a pattern is out of spec, for example, and to perform a report out to software 790 if the pattern is outside of specification requirements. Additionally, the protocol analyzer can comprise memory 750 that stores particular sequences, e.g., repeating sequences identified by the data compressor. It should be noted that the memory 750 for the protocol analyzer of the present invention will be significantly less than a memory required for a conventional protocol analyzer because the protocol analyzer of the present invention will only save critical information that needs to be reported out to the user and discard the less critical information.

As stated above, in one embodiment, the protocol analyzer can be programmed on an FPGA alongside a third party IP core 720. The protocol analyzer can, for example, extracts data from the third party IP core 720 pertaining to the communication between the protocol core 720 and the DUT. The protocol core 720 communicates through the DUT through PHY layer 710. The PHY layer 710 connects the protocol core module 720 to a physical medium, e.g., optical fiber, copper cable etc. The protocol analyzer compresses the data down (in other words, selects the data that it wants to save), and also checks the data to determine if there are any issues with the data. As mentioned above compressor module 770 selects the repeating data and compresses it down while the checker module 780 actively discards less critical information. The protocol analyzer can present the information regarding the data in a useful manner e.g., if the data falls within specification, the information can be reported out succinctly to software 790. Alternatively, the report out only takes place when data falls outside of specification, which is more efficient.

Figure 8:
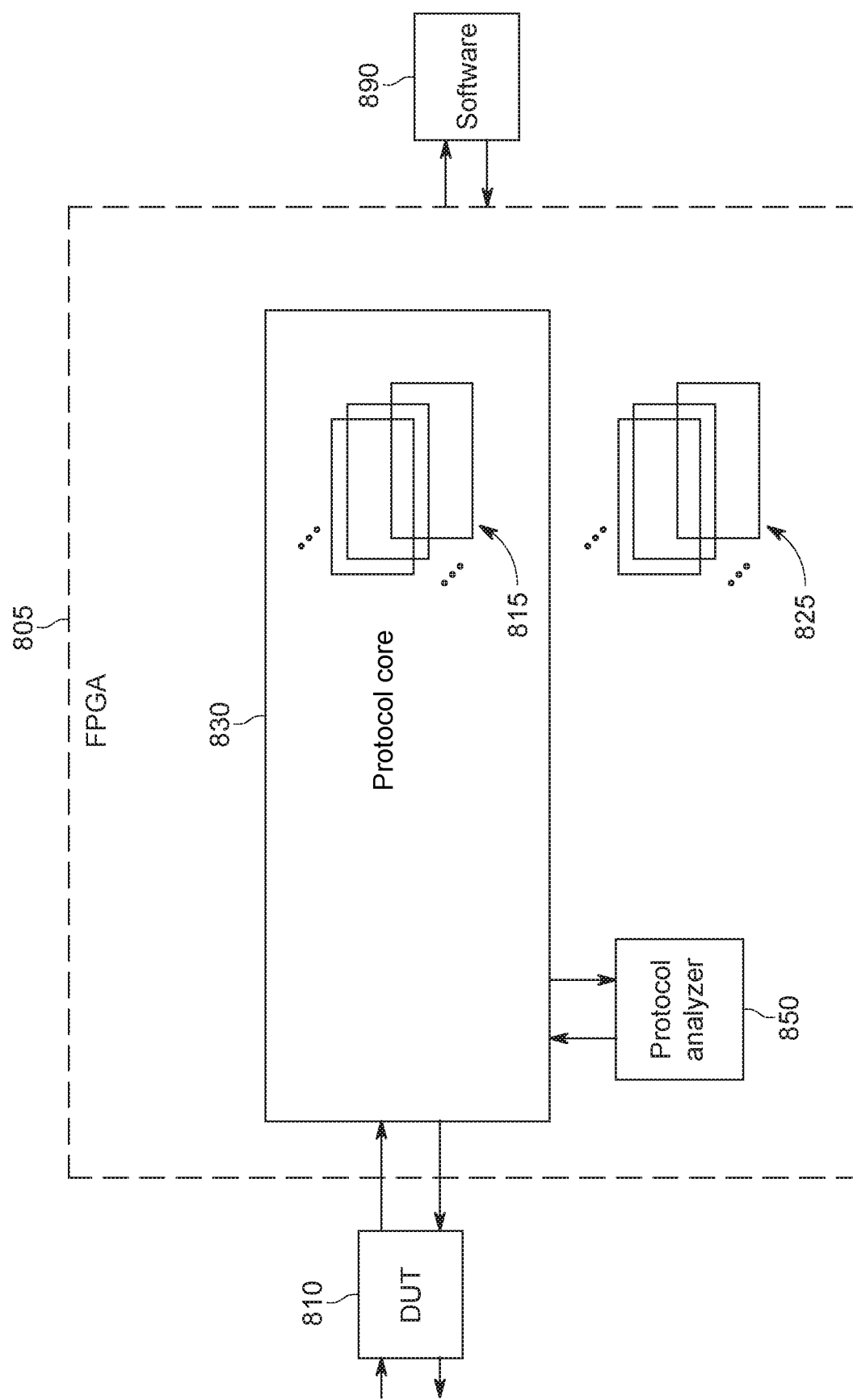
FIG. 8 is a high-level block diagram illustrating the manner in which the protocol analyzer of the present invention works in conjunction with the capture modules in the FPGA to report data in accordance with an embodiment of the present invention.

In one embodiment, the capture modules discussed in FIGS. 4 and 5 may be used in conjunction with the protocol analyzer of FIG. 7. FIG. 8 is a high-level block diagram illustrating the manner in which the protocol analyzer of the present invention works in conjunction with the capture modules in the FPGA to report data in accordance with an embodiment of the present invention.

In one embodiment, FPGA 805 comprises a protocol analyzer 850 and a protocol 830, wherein the protocol core comprises multiple capture modules 815. FPGA 805 also comprises other capture modules 825, which as discussed above, may be programmed to perform one of several different functions. The protocol core 830 communicates with DUT 810 through a PHY layer (not shown). The FPGA 805 communicates information gathered by the capture modules and the protocol analyzer to the tester software 890.

In one embodiment, the capture modules 815 within the protocol core 830 may capture information to be directed to the protocol analyzer 850. For example, certain repeating sequences may be initially captured by the capture modules 815 and transmitted to the protocol analyzer where the data compressor 770 identifies the sequence and maintains a count in conjunction with the collection logic 740. In one embodiment, there can be multiple capture modules 815 per protocol core that can be used to store data useful to perform protocol analysis.

In one embodiment, the protocol traffic captured from the capture modules (e.g., capture modules 815 and 825) and the protocol analyzer can be transmitted to software 890 and converted into a graphical illustration. Most conventional protocol analyzers display the data in a graphical format. Accordingly, embodiments of the present invention facilitate analysis by displaying the data captured graphically. The graphical interface is usually easier to use because the data has been sorted and labeled to highlight key features of the communication that would otherwise need to be manually tease out of the raw textual data by referring to the protocol specification. Accordingly, software 890 can perform further post-processing of the data gathered from the capture modules and the protocol analyzer in order for the user to be able to view the data in a graphical manner.

Figure 9:
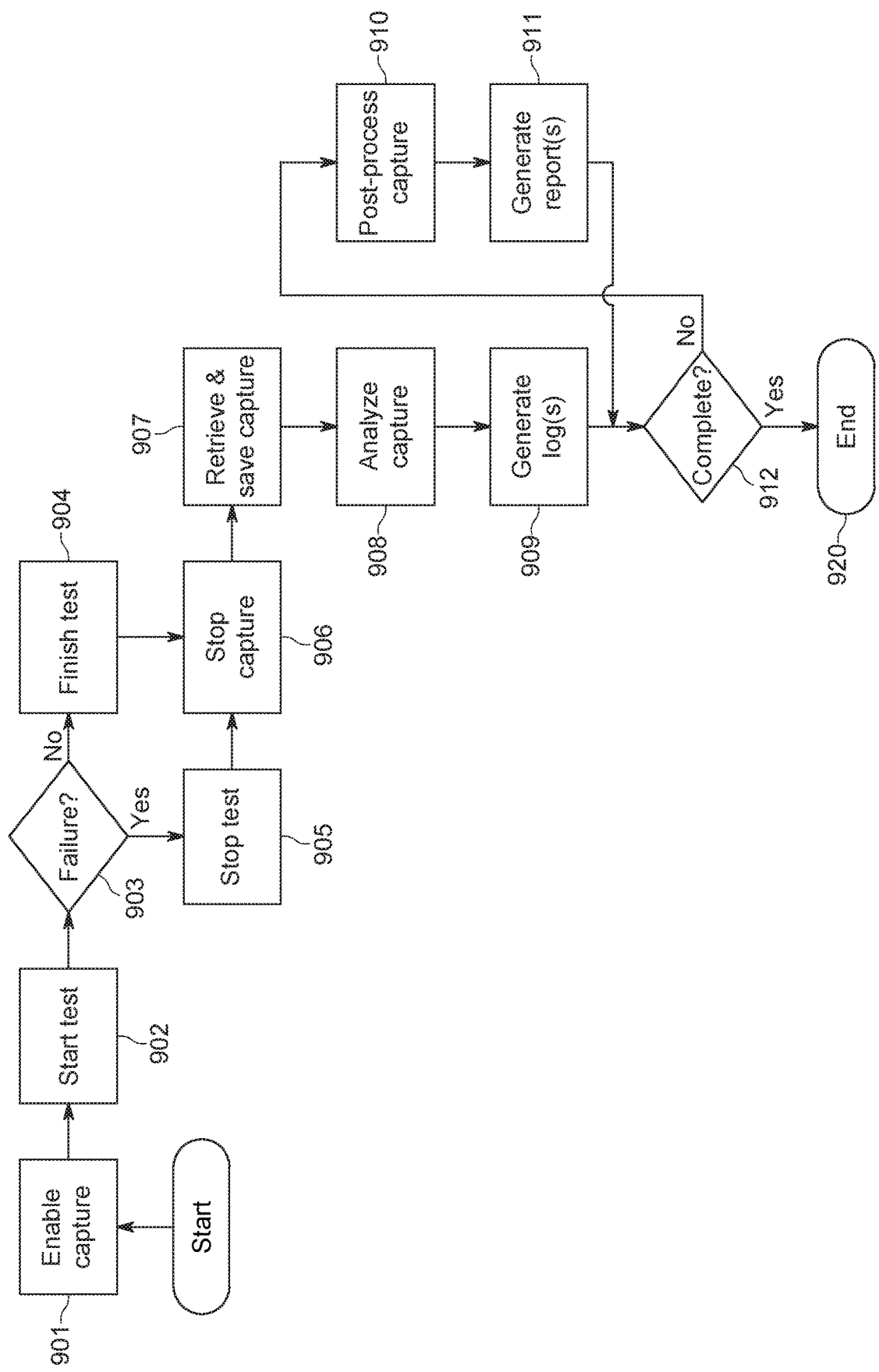
FIG. 9 illustrates a flowchart of an exemplary computer implemented process for capturing critical information during the course of automated device testing in order to determine root causes for device failure in accordance with one embodiment of the present invention.

FIG. 9 illustrates a flowchart of an exemplary computer implemented process for capturing critical information during the course of automated device testing in order to determine root causes for device failure in accordance with one embodiment of the present invention.

At step 901, capture is enabled for a particular test. This typically involves setting up the traffic capture including setting up the various configurations to enable and start the test. For example, the user would have to program the FPGA and determine the type and number of capture modules to include within the FPGA.

At step 902, the test is started. At step 903, if a failure is detected, the test is stopped at step 905. Subsequently, the capturing is stopped at step 906. If no failure is detected, the test is allowed to run its course until it finishes at step 904. Subsequently, the capturing is stopped at step 906.

Thereafter, the captured results are retrieved and saved at step 607 using the tester software. For example, the captured results may be saved and downloaded into software 905.

Once the data is gathered, at step 908, it can be analyzed either manually or automatically, e.g., using a rule-checker.

At step 909, logs are generated related to the test. At step 912, if there is no more data to process and the test is complete, the test ends at step 920. If, however, there is more data to process, a post-process analysis is run on the data at step 910. In one embodiment, the post-process analysis typically involves analyzing the logs to determine the root cause of device failure as explained in related U.S. patent application Ser. No. 15/916,126, filed Mar. 8, 2018, entitled "A LOG POST PROCESSOR FOR IDENTIFYING ROOT CAUSES OF DEVICE FAILURE DURING AUTOMATED TESTING." However, there may be other types of post-processing performed on the data as well. For example, the data along with the additional metadata with timestamps stored in the capture module memory 530 may not be in a format easily discernible by the user. The post-processing at step 909 may convert the information retrieved from the capture modules into a format that a user can easily understand and use.

At step 911, a report is generated regarding the test. For example, the report may identify the root cause of a device failure or alert the user regarding any devices that may imminently fail.

Figure 10:
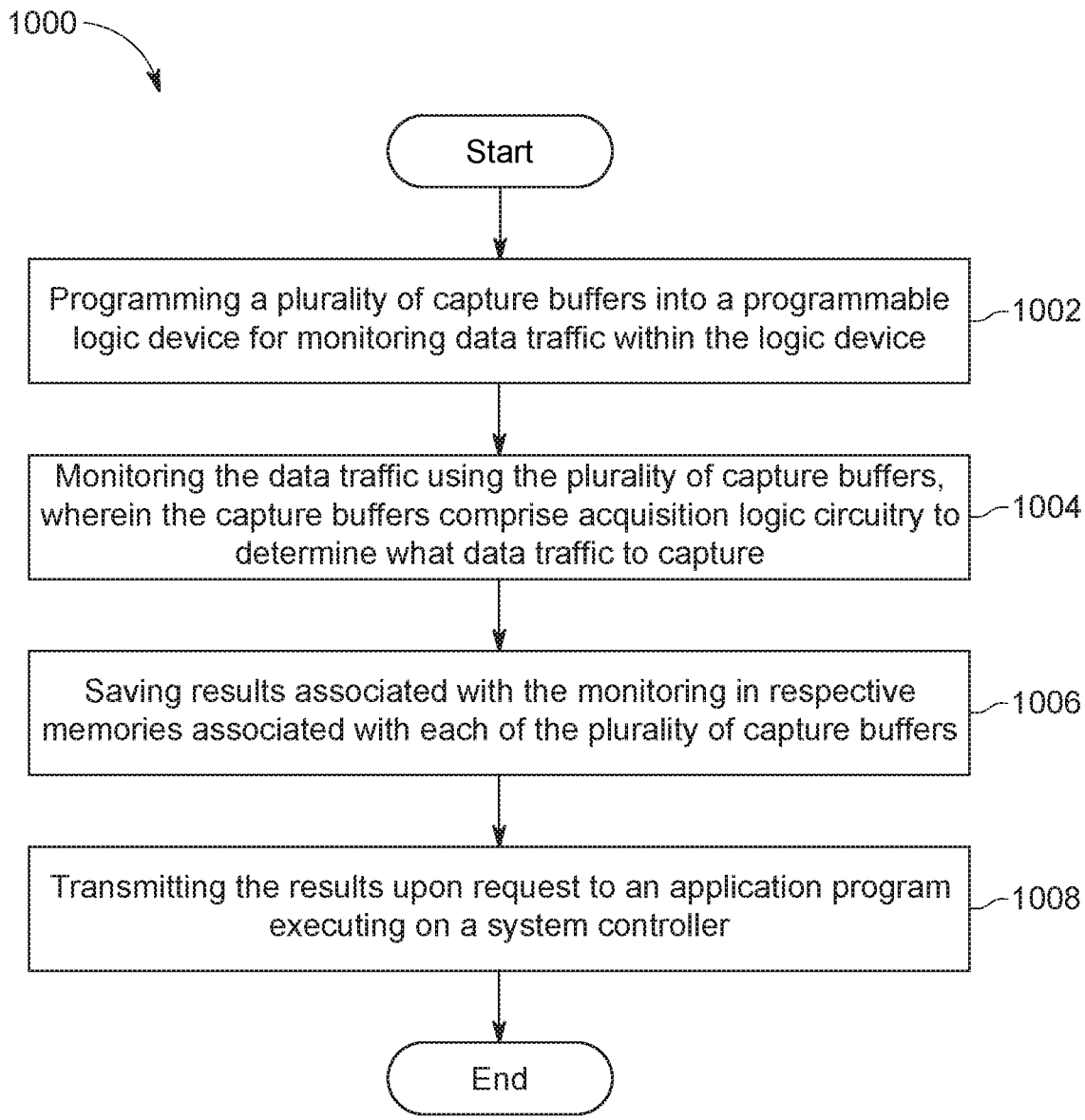
FIG. 10 illustrates a flowchart of an exemplary computer implemented process for using capture modules during automated device testing for monitoring data traffic and diagnosing problems in accordance with one embodiment of the present invention.

FIG. 10 illustrates a flowchart of an exemplary computer implemented process for using capture modules during automated device testing for monitoring data traffic and diagnosing problems in accordance with one embodiment of the present invention.

At step 1002, a plurality of capture modules is programmed into a programmable logic device, e.g., an FPGA to monitor data traffic associated with a test on the FPGA. The FPGA, e.g., FPGA 495 is connected to a plurality of DUTs, e.g., DUTS 496A-496N to be tested. Further, the FPGA is also connected to a system controller, e.g., system controller 301 that executes the tester software application program for coordinating the tests. As mentioned above, the user can select the type and number of capture modules to program into the logic device prior to downloading the bit-file for programming the FPGA.

At step 1004, the data traffic in the FPGA is monitored using the capture modules. The capture modules comprise acquisition logic circuitry 520 that determines the relevant data to capture and monitor.

At step 1006, the results associated with the monitoring are saved in respective memories within each of the plurality of capture modules.

Finally, at step 1008, the results are transmitted to the tester software application program executing on the system controller.

Figure 11:
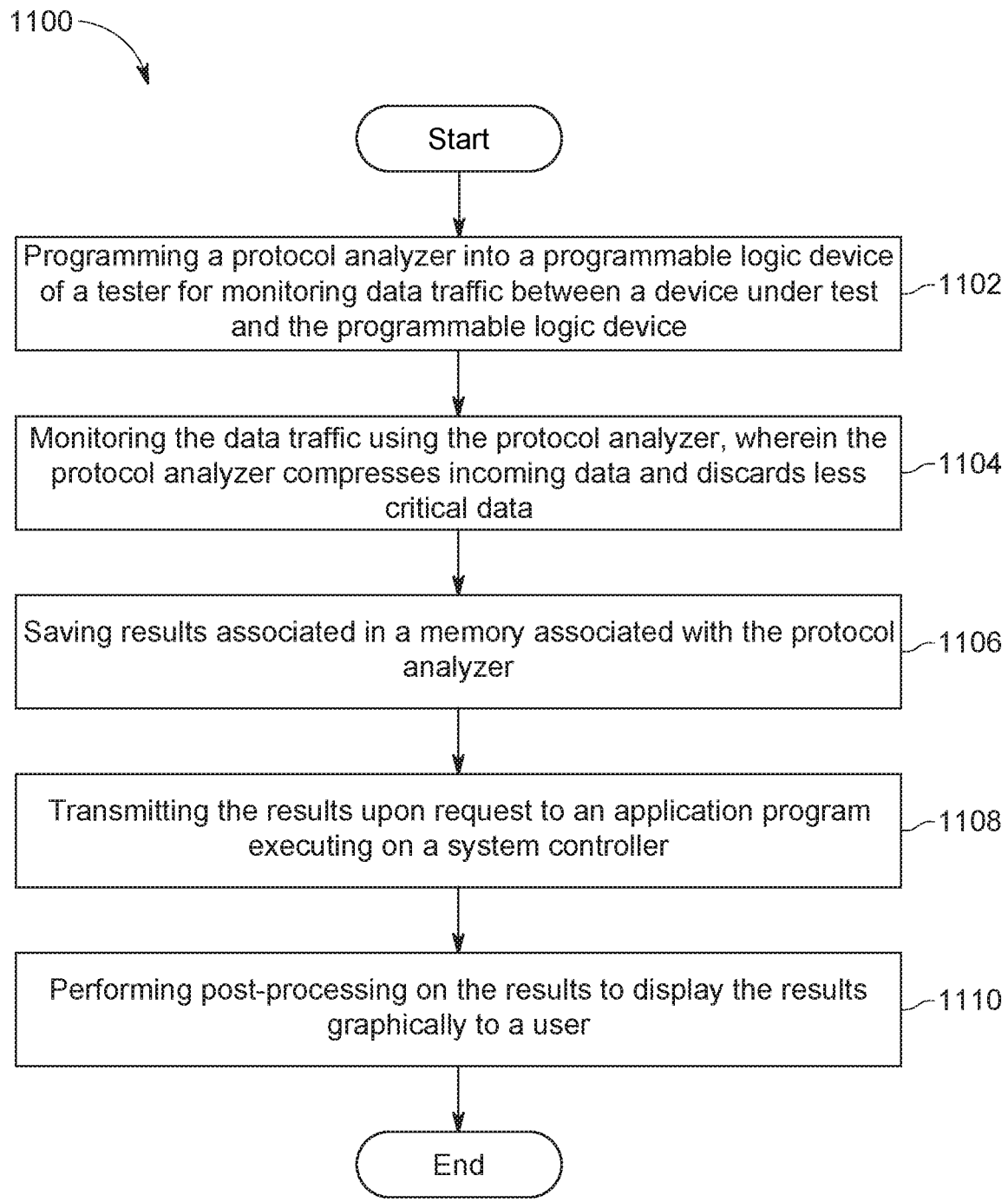
FIG. 11 illustrates a flowchart of an exemplary computer implemented process for programming a protocol analyzer in a tester to collect and display information in accordance with one embodiment of the present invention.

FIG. 11 illustrates a flowchart of an exemplary computer implemented process for programming a protocol analyzer in a tester to collect and display information in accordance with one embodiment of the present invention.

At step 1102, a protocol analyzer is programmed into a programmable logic device, e.g., an FPGA to monitor data traffic between the FPGA and a connected DUT. More specifically, the protocol analyzer would monitor the signals transmitted from and received by the protocol core 830 of the FPGA. The FPGA, e.g., FPGA 805 is connected to one or more DUTs, e.g., DUT 810 to be tested. Further, the FPGA is also connected to a system controller, e.g., system controller 301 that executes the tester software application program for coordinating the tests.

At step 1104, the data traffic between the connected DUT and the FPGA is monitored using the protocol analyzer. The protocol analyzer comprises a data compressor module 770 that compresses data being exchanged on communication link 702 (the link between the protocol core 720 and the DUTs) by identifying identical sequences that repeat. Further, the protocol analyzer can also selectively discard certain information using a data checker module 780.

At step 1106, the results associated with the monitoring are saved in a memory associated with the protocol analyzer.

Subsequently, at step 1108, the results are transmitted to the tester software application program executing on the system controller.

Finally, at step 1110, the system controller performs post-processing on the results (which may be in text format) and renders them for graphical display for a user.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A method for monitoring communications between a device under test (DUT) and an automated test equipment (ATE), the method comprising:
   monitoring data traffic associated with testing a DUT using a protocol analyzer module, wherein the data traffic comprises a flow of traffic between the DUT and a protocol core of a programmable logic device, wherein the programmable logic device is a Field Programmable Gate Array (FPGA), wherein the protocol analyzer module is integrated within the FPGA, wherein the protocol analyzer module is programmed onto the FPGA and uses memory resources associated with the FPGA, wherein the programmable logic device is controlled by a system controller and is operable to generate commands and data to test the DUT, wherein the protocol core is operable to generate signals to communicate with the DUT using a protocol associated with the DUT, and wherein the protocol analyzer module is operable to compress data sequences in the flow of traffic and selectively discard less critical data from the flow of traffic;
   storing results associated with the monitoring in a memory associated with the protocol analyzer module; and
   transmitting the results upon request to an application program executing on the system controller.

2. The method of claim 1, further comprising:
   performing post-processing on the results; and
   displaying the results graphically on a screen for a user.

3. The method of claim 1, wherein the protocol emulated by the protocol core is selected from a group consisting of: Peripheral Component Interconnect Express (PCIe), Serial AT Attachment (SATA) or Serial Attached SCSI (SAS).

4. The method of claim 1, wherein the protocol analyzer module is operable to compress the data sequences by:
   identifying repeating sequences from the data sequences;
   storing a single copy of a repeating sequence in the memory; and
   maintaining a count of a number of repetitions of the repeating sequence.

5. The method of claim 1, wherein the protocol analyzer module is operable to selectively discard less critical data by:
   identifying specific sequences from the flow of traffic;
   determining if the specific sequences are in accordance with specification requirements;
   responsive to a determination that the specific sequences are in accordance with specification requirements, discarding the specific sequences; and
   responsive to a determination that the specific sequences are not in accordance with specification requirements, transmitting a report through the application program.

6. The method of claim 1, wherein the protocol core comprises a plurality of programmable capture modules, and wherein the monitoring further comprises: capturing the data traffic into the programmable capture modules; and
   transmitting the data traffic to the protocol analyzer module for further analysis.

7. An apparatus for diagnosing a cause of failure using automated test equipment (ATE), the apparatus comprising:
   a computer system comprising a system controller, wherein the system controller is communicatively coupled to a site module board comprising a tester processor and a programmable logic device, wherein the system controller is operable to transmit instructions to perform a test on a device under test (DUT) to the tester processor and the programmable logic device; and
   the programmable logic device communicatively coupled to the DUT and operable to generate commands and data for executing the test on the DUT, wherein the programmable logic device is an FPGA, and wherein the FPGA comprises a protocol analyzer module programmed on the FPGA and using memory resources associated with the FPGA, and wherein the protocol analyzer module is operable to:
   monitor data traffic associated with testing the DUT, wherein the data traffic monitored comprises a flow of traffic between the DUT and a protocol core programmed on the programmable logic device;
   compress data sequences in the flow of traffic and selectively discard less critical data from the flow of traffic;
   store results associated with monitoring the data traffic in a memory associated with the protocol analyzer module; and
   transmit the results upon request to a tester application program executing on the system controller.

8. The apparatus of claim 7, wherein the tester application program is operable to:
   perform post-processing on the results; and
   display the results graphically on a screen for a user.

9. The apparatus of claim 7, wherein the protocol core is operable to emulate a protocol to generate signals to communicate with the DUT using a protocol associated with the DUT.

10. The apparatus of claim 9, wherein the protocol emulated by the protocol core is selected from a group consisting of: Peripheral Component Interconnect Express (PCIe), Serial AT Attachment (SATA) or Serial Attached SCSI (SAS).

11. The apparatus of claim 7, wherein the protocol analyzer module is operable to perform compression on the data sequences by:
identifying repeating sequences from the data sequences;
storing a single copy of a repeating sequence in the memory; and
maintaining a count of a number of repetitions of the repeating sequence.

12. The apparatus of claim 7, wherein the protocol analyzer module is operable to selectively discard less critical data by:
identifying specific sequences from the flow of traffic;
determining if the specific sequences are in accordance with specification requirements;
responsive to a determination that the specific sequences are in accordance with specification requirements, discarding the specific sequences; and
responsive to a determination that the specific sequences are not in accordance with specification requirements, transmitting a report out through the application program.

13. A tester comprising:
a system controller for controlling a test program for testing a plurality of DUTs;
a plurality of modules operable to interface with and test the plurality of DUTs, the plurality of modules coupled to the system controller, wherein each module comprises a site module board, and wherein each site module board comprises:
a tester processor coupled to communicate with the system controller to receive instructions and data therefrom in accordance with the test program; and
a plurality of programmable logic devices coupled to the tester processor, wherein the plurality of programmable logic devices comprise FPGAs, each programmable logic device comprising a protocol core and operable to generate test data for application to a respective DUT, further operable to receive and compare test data generated by the respective DUT, and further yet the protocol core of each programmable logic device operable to be programmed to communicate with the respective DUT in a communication protocol compatible with the respective DUT, and wherein each of the FPGAs comprise a protocol analyzer module, wherein the protocol analyzer module is programmed on the FPGA and operable to:
monitor data traffic associated with testing the DUT, wherein the data traffic monitored is between the DUT and the protocol core;
perform compression on data sequences in the data traffic and selectively discard less critical data from the data traffic;
store results associated with monitoring the data traffic in a memory associated with the protocol analyzer module; and
transmit the results upon request to a tester application program executing on the system controller.

14. The tester of claim 13, wherein the tester application program is operable to:
perform post-processing on the results; and
display the results graphically on a screen for a user.

15. The tester of claim 13, wherein the protocol used by the protocol core to communicate with the DUT is selected from a group consisting of: Peripheral Component Interconnect Express (PCIe), Serial AT Attachment (SATA) or Serial Attached SCSI (SAS).

16. The tester of claim 13, wherein the protocol analyzer module is operable to perform compression on the data sequences by:
identifying repeating sequences from the data sequences;
storing a single copy of a repeating sequence in the memory; and
maintaining a count of a number of repetitions of the repeating sequence.

17. The tester of claim 13, wherein the protocol analyzer modules is operable to selectively discard less critical data by:
identifying specific sequences from the data traffic;
determining if the specific sequences are in accordance with specification requirements;
responsive to a determination that the specific sequences are in accordance with specification requirements, discarding the specific sequences; and
responsive to a determination that the specific sequences are not in accordance with specification requirements, transmitting a report out to a user through the application program.

\* \* \* \* \*